United States Patent [19]
Wuu et al.

[11] Patent Number: 5,668,380
[45] Date of Patent: Sep. 16, 1997

[54] REDUCED AREA METAL CONTACT TO A THIN POLYSILICON LAYER CONTACT STRUCTURE HAVING LOW OHMIC RESISTANCE

[75] Inventors: Shou-Gwo Wuu; Mong-Song Liang; Chung-Hui Su; Chen-Jong Wang, all of Hsin-chu, Taiwan

[73] Assignee: Taiwan Semiconductor Manufacturing Company, Ltd, Hsin-chu, Taiwan

[21] Appl. No.: 612,398

[22] Filed: Mar. 7, 1996

Related U.S. Application Data

[62] Division of Ser. No. 429,228, Apr. 27, 1995, Pat. No. 5,534,451.

[51] Int. Cl.⁶ .......................... H01L 29/76; H01L 27/108; H01L 23/48; H01L 27/11
[52] U.S. Cl. .................. 257/66; 257/67; 257/69; 257/74; 257/756; 257/903
[58] Field of Search ..................... 257/57, 66, 67, 257/69, 74, 751, 756, 903, 904; 437/52

[56] References Cited

U.S. PATENT DOCUMENTS 5,272,103  12/1993  Nakamura ..................... 437/52
5,379,251   1/1995  Takeda et al. .................. 257/903
5,391,894   2/1995  Itabashi et al. ................. 257/903

*Primary Examiner*—Steven H. Loke
*Attorney, Agent, or Firm*—George O. Saile

[57] ABSTRACT

Reduced area metal contacts to a thin polysilicon layer contact structure having low ohmic resistance was achieved. The structure involves forming contact openings in an insulating layer over a buffer layer composed of a thick polysilicon layer. A portion of the sidewall in the opening includes a patterned thin polysilicon layer that forms part of a semiconductor device and also forms the electrical connection to the metal contact. The structure provides metal contacts having very low resistance and reduced area for increased device packing densities. The metal contact structure also eliminates the problem of forming P⁺/N⁺ non-ohmic junctions usually associated with making P⁺/N⁺ stacked contact. The structure further allows process steps to be used that provide larger latitude in etching the contact opening and thereby provides a structure that is very manufacturable.

3 Claims, 7 Drawing Sheets

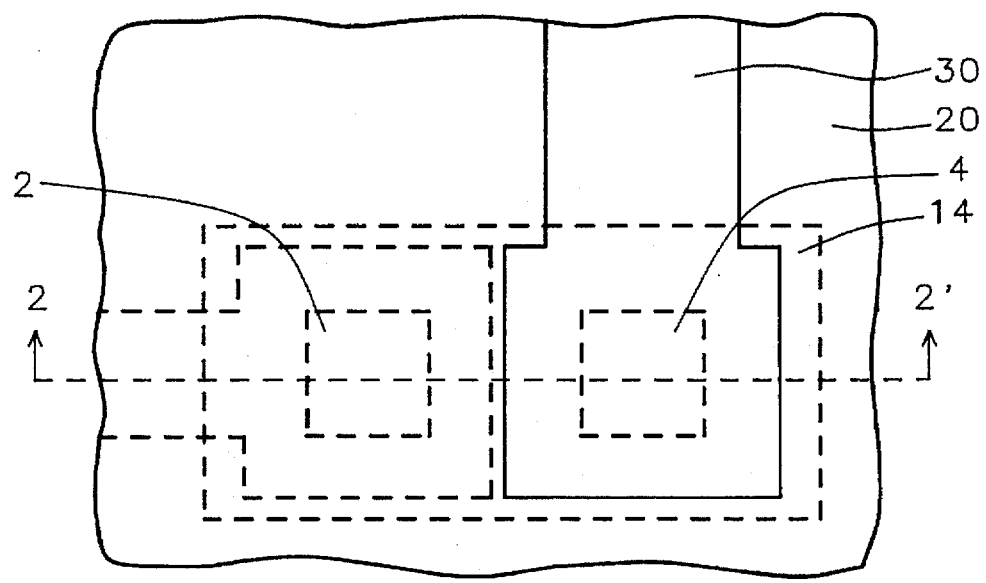
FIG. 1 - Prior Art
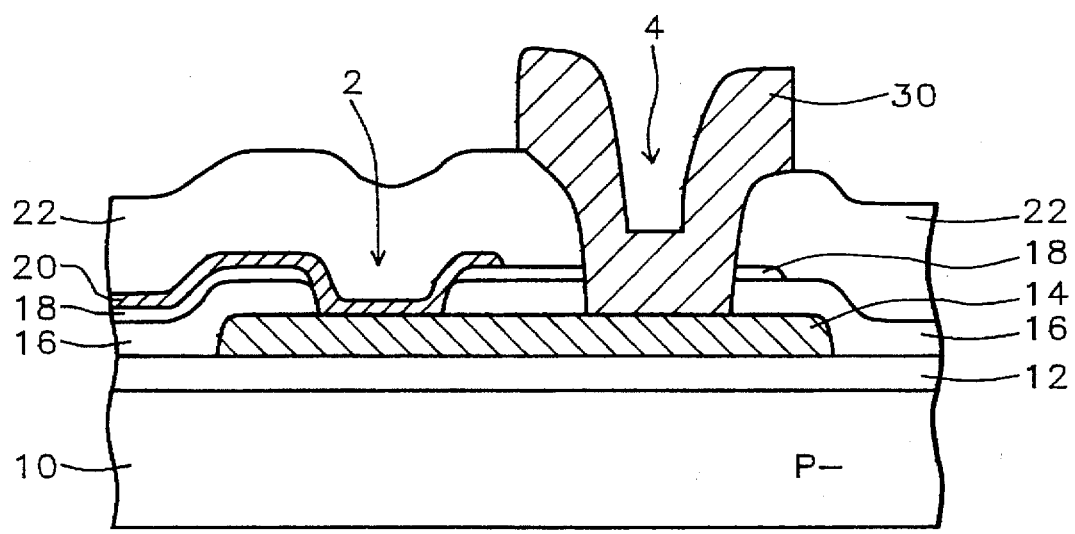
FIG. 2 - Prior Art

REDUCED AREA METAL CONTACT TO A THIN POLYSILICON LAYER CONTACT STRUCTURE HAVING LOW OHMIC RESISTANCE

This application is a divisional application of U.S. patent application Ser. No. 08/429,728, filed Apr. 27, 1995, now U.S. Pat. No. 5,534,451.

BACKGROUND OF THE INVENTION (1) Field of the Invention

The present invention relates to integrated circuits on semiconductor substrates, and more particularly to the fabrication metal contacts to thin amorphous or polysilicon layers having low resistance ohmic characteristics.

(2) Description of the Prior Art

Down scaling and increased packing densities of semiconductor devices on substrates have greatly increased the circuit density on the semiconductor substrate. This increased circuit density has significantly improved the circuit performance and has reduced the cost of todays electronic products.

However, as efforts are made in the semiconductor industry to further down scale the devices, process problems on the substrate and electrical limitations on the devices have made it difficult to manufacture integrated circuits with improved performance. One of the process limitations is the ability to accurately and repeatedly control the etching of contact openings in relatively thick insulating layers to the surface of relatively thin amorphous or polysilicon layers (e.g. <500 Angstroms) that make up part of todays semiconductor devices and the electrical interconnections.

This etch control problem is particularly acute on SRAM circuits having thin film transistors (TFT) as part of the latch circuit on the memory cell. The thin film transistor is usually composed in part of a patterned continuous thin amorphous silicon layer, for example, between about 50 to 700 Angstroms in thickness. This patterned amorphous or polysilicon layer serves as the TFT channel layer, the $P^+$ source/drain areas and the $P^+$ doped stripe that form the interconnect to the power supply voltage, usually designated $V_{cc}$. The metal contact for the power supply voltage is made through an opening in an insulating layer to the $P^+$ stripe. Unfortunately, it is difficult to accurately control the etch stop to the thin silicon layer (<700 Angstroms), and therefore unreliable contacts can result. To circumvent this problem, it is common practice in the, prior art, to form an underlying thicker pad polysilicon layer patterned from a previously deposited polysilicon layer. This patterning polysilicon layer functions as a buffer layer to which both the thin $P^+$ stripe and metal contacts are made.

This prior art method and its limitations are best understood by referring to the FIGS. 1 and 2 for forming the contact to the TFT channel layer on the SRAM cell. An elevational schematic view is shown in FIG. 1 for the completed contact structure and a cross sectional schematic view is shown in FIG. 2 for the region 2—2' in FIG. 1. Referring now to FIG. 2 the prior art contact structure is shown with the various parts also labeled the same as in FIG. 1. A portion of the substrate 10 is shown after completing the P-channel thin film transistor and other circuit elements on the SRAM device. The patterned buffer polysilicon layer 14 is shown formed on a previously deposited first insulating layer 12. The patterned layer 14 is usually formed at an earlier process step, such as when the N+ bit lines are formed for the SRAM device. A second insulating layer 16, also deposited during an earlier processing step is shown deposited over the buffer polysilicon layer 14. After forming the gate electrode (not shown) for the thin film transistor (TFT) a thin gate oxide is formed on the gate electrode, and this oxide also extends over the contact area and is shown as insulating layer 18. A first contact opening 2 is then etched in the gate oxide 18 and the second insulating layer 16 to the surface of the buffer polysilicon layer 14. Now when the thin channel layer polysilicon 20 is deposited to form the channel for the TFT gate electrode, it also extends over and in the contact opening 2. Layer 20 is then implanted to form the source/drain of the TFT (not shown), and also implanted over the opening 2 to make a $P^+/N^+$ junction to the buffer layer 14. After patterning the channel layer 20 to define the channel width and interconnect to the opening 2, a thick third insulating layer 22 is then deposited and a second contact opening 4 is etched adjacent to the first contact opening 2 through layers 22, 18 and 16 to the buffer layer surface 14. A metal layer 30 is deposited and patterned to form the contact in opening 4 that is used to apply a voltage $V_{cc}$ to the source of the TFT.

Unfortunately, the buffer pad polysilicon layer requires additional space on the chip and therefore limits the packing density of devices. And secondly, the $P^+/N^+$ contact results in a contact with diode characteristics that degrade the SRAM electrical performance. Therefore there is still a strong need in the semiconductor industry for making a small low resistance ohmic contact.

SUMMARY OF THE INVENTION

It is a principle object of this invention to provide a method for fabricating metal contacts to a thin amorphous or polysilicon contact structure having reduced contact area.

It is another object of this invention to provide methods for fabricating these metal contacts so that stacked doped polysilicon contacts having $P^+/N^+$ diode junction current-voltage (I/V) characteristics are replaced by low resistance ohmic contacts.

It is still another object to fabricate these low resistance ohmic contact for a P–channel thin film transistor (TFT).

And it is still another object of this invention to fabricate this metal contact with reduced size and low resistance without increasing the number of masking levels, and thereby providing a cost effective manufacturing process.

In accordance with a first embodiment of this invention a method is described for making a low resistance ohmic contacts to a thin polysilicon layer, such as is used to make a P-channel thin film transistor (TFT) on static random access memory (SRAM) chips. The method beings by providing a semiconducting substrate, composed, for example, of $P^-$ doped single crystal silicon. After forming electrically isolating field oxide areas, such as by the LOCal Oxidation of Silicon (LOCOS) for isolating the device areas, N-channel field effect transistors (pass transistor) having gate electrodes and interconnecting word lines are formed from an N-doped first polysilicon layer in the device areas. After forming the source/drain areas for the FETs, a first insulating layer is deposited and then a second polysilicon layer, also N-doped, is deposited and patterned to form the bit lines that contact of the source/drain areas on each pass transistor through opening in the first insulating layer. A portion of the patterned second polysilicon layer is used as a thick buffer layer whereon the reduced area metal contacts are formed at the same time that the P-channel TFT are made as part of the SRAM cell.

A second insulating layer is deposited over the patterned second polysilicon layer that include the buffer layer portions and then a third polysilicon layer is deposited and patterned by conventional photolithographic techniques and dry etching to form the gate electrode of the P-channel TFT. A third insulating layer is next deposited to form a thin gate oxide, such as silicon oxide, on the TFT gate electrode and also extending over the buffer layer areas. A first contact opening is etched in the third and second insulating layer over the buffer layer area and a relatively thin fourth polysilicon layer is deposited over the TFT gate electrode and over and in the contact opening. The fourth polysilicon layer is selectively doped with a P type dopant to form the source/drain areas of the TFT while leaving undoped the channel areas over the TFT gate electrode areas, but also doping the fourth polysilicon layer over the buffer layer. The fourth polysilicon layer is then patterned by photoresist masking and dry etching to form electrically conducting connecting stripes between the source of the TFT and the first contact opening. A fourth insulating layer is deposited on the patterned fourth polysilicon layer, and a second contact opening is anisotropically etched in the fourth insulating aligned over and smaller in width than the first contact opening. The second contact opening is etched to the third polysilicon layer that is over and contacting the buffer layer. Over etch control is not critical and etching into the buffer layer is allowable in this invention. Finally, the metal contact is completed by depositing a first metal layer over the fourth insulating layer and in the contact opening, thereby making contact to the $P^+$ doped patterned fourth polysilicon layer in the bottom of the contact and/or on the sidewall of the contact. The first metal layer is patterned by masking and etching to complete the structure to the first metal wiring having low resistance ohmic contacts and reduced area that is made in part during the fabrication of the P-TFT.

The second embodiment of the invention is similar to the first embodiment with the following exceptions. The first contact opening is omitted in the second embodiment. A single contact opening is etched in the fourth insulating layer to the buffer layer formed from the second polysilicon layer. As a result the contact opening is self-aligned to the patterned fourth polysilicon (channel layer of TFT) which is formed as part of the sidewall in the contact opening during etching. The fourth polysilicon layer is also not in contact with the buffer layer, but over and insulated from the buffer layer by the thickness of the second and third insulating layers. Because the contact is self-aligned, the area of the contact is further reduced over the first embodiment. The process is completed by depositing the first metal layer in the contact opening and patterning the first metal to form the wiring. Because the metal contacts the sidewall of the fourth polysilicon, the contact is ohmic in nature and has very low resistance similar to the first embodiment and a big improvement of the prior art.

BRIEF DESCRIPTION OF THE DRAWINGS

The objects and other advantages of the invention will become more apparent for both the first and second preferred embodiment when read in conjunction with the following drawings.

FIG. 1 shows an schematic elevational view of the prior art for a conventional contact to a thin polysilicon film.

FIG. 2 shows a schematic cross sectional view through the conventional contact of FIG. 1.

DESCRIPTION OF THE PREFERRED EMBODIMENTS

The first embodiment of the invention relates to the formation of an improved metal contact to a doped thin polysilicon layer, such as used on the P-channel thin film transistor (TFT) of a SRAM cell. Part of the contact structure is formed at the same time as the P-channel thin film transistors (TFT) is formed on the SRAM cell. However, it should be well understood by those skilled in the art that the method can be equally applied to other semiconductor integrated circuits requiring good low resistance contact to thin polysilicon films. It should also be noted that although the process relates to making a contact to a TFT, that to simplify the drawings only the contact portion of the substrate is shown in the Figs. However, to fully understand the meaning of the various layer present in the contact structure, reference will be made from time to time to the method of using the various layers in the thin film transistor structure that also are present in the Figs. It should also be noted that the TFT and the contacts are usually formed on the SRAM chip after first forming the array of N-channel FET and the word and bit lines from an earlier use of a first and second polysilicon layer.

Figure 3:
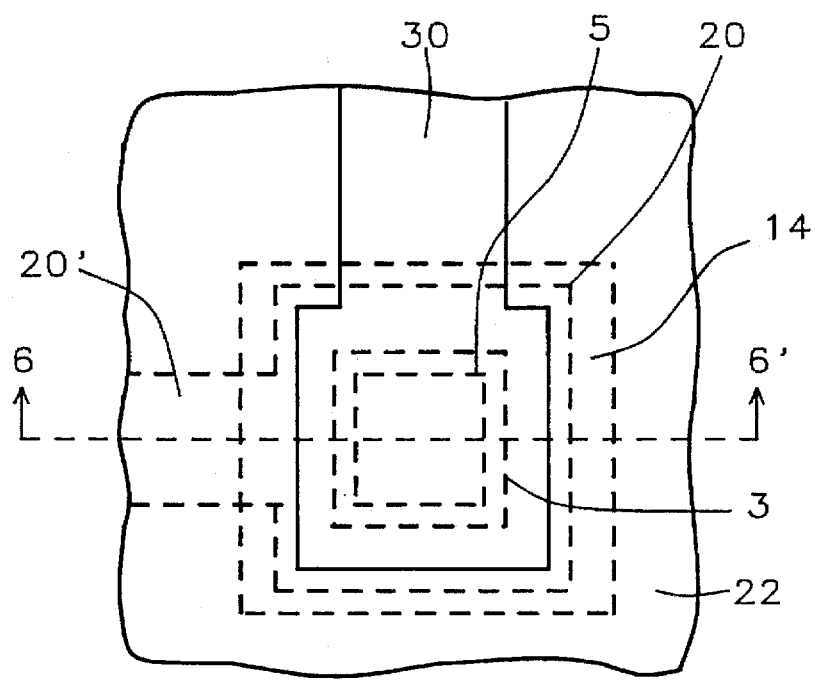
FIG. 3 shows a schematic elevational view for the first embodiment of the invention.
Figure 4A:
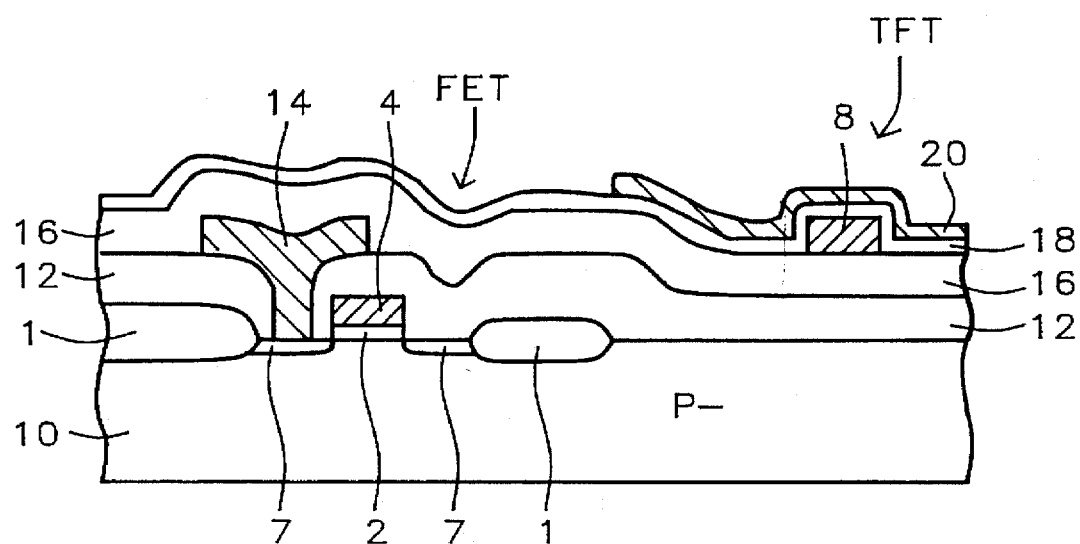
FIGS. 4A, 4B, 5 and 6 show a schematic cross sectional views of the metal contact structure of the first embodiment.
Figure 6:
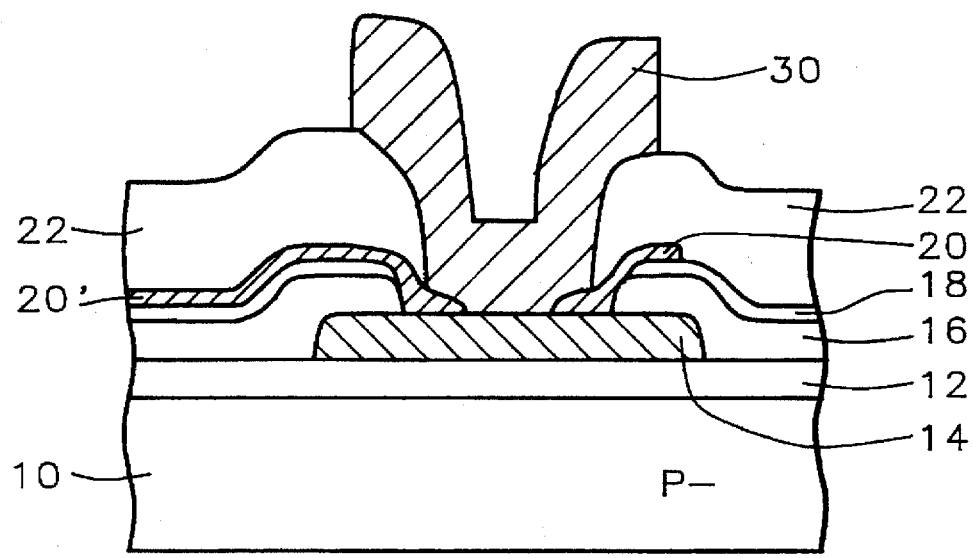

To better understand the invention for making the reduced area metal contact to a thin polysilicon layer, a brief description is given of the fabrication of the initial SRAM device process. However, since these structures are not critical to understanding the invention, they are also not depicted in any of the drawing. The process for making a SRAM circuit starts by providing a semiconductor substrate, such as on a $P^-$ doped single crystal silicon substrate. Device areas are formed and electrically isolated by forming a field oxide. Typically, the electrically isolated device areas are formed by selectively oxidizing the regions around the device areas, for example, by using a conventional LOCal Oxidation of Silicon (LOCOS) process. The N-channel FETs, usually referred to as pass transistors, are formed by growing a gate oxide on the device areas and then using a patterned first polysilicon layer to form the field effect transistor gate electrodes and the word lines. The source and drain areas are formed adjacent to the gate electrodes usually by ion implantation. A first insulating layer is deposited to electrically insulate the N-FETs and word lines from the next level of patterned second polysilicon layer, which is used to form the bit lines that contact some of the source/drain areas on the N-channel FET. However, it should be noted that when the second polysilicon layer is patterned, a portion of the second polysilicon is used in the SRAM cell areas as a buffer layer whereon the metal contact, of this invention, are made to the thin polysilicon layer of the TFT. This buffer layer 14, shown in FIG. 4B in cross section, and labeled 14 in the top view of FIG. 3, is formed at the same time and from the same patterned second polysilicon layer 14 shown in FIG. 4A that forms the bit line 14 for the FET. The completed contact in FIG. 6 is through region 6—6' in FIG. 3.

Figure 4B:
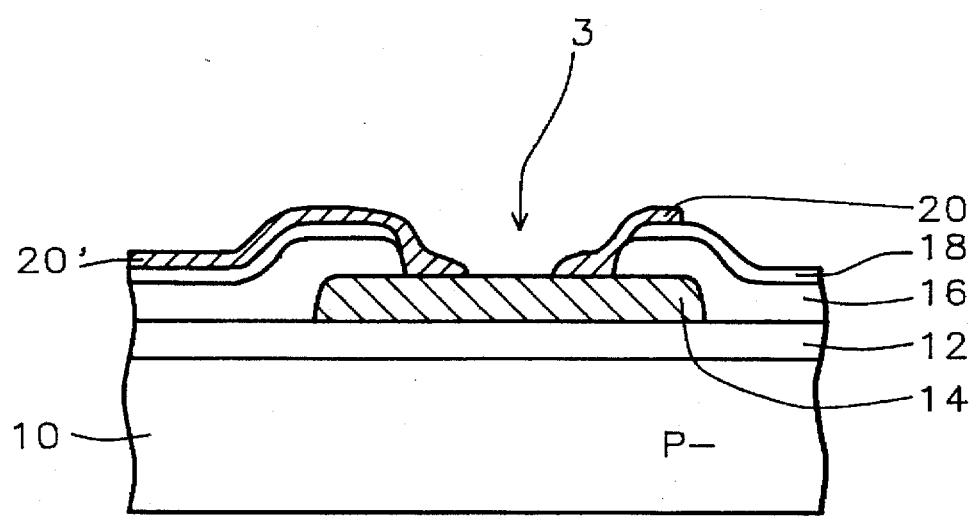

Referring now to FIGS. 4B, a partially completed contact structure is shown on a portion of the substrate 10. Shown is the first insulating layer 12, which is typically deposited by low pressure chemical vapor deposition (CVD) in a reactor, for example, by the dissociation of a tetraethosiloxane (TEOS) at a temperature of between about 700° to 850° C. The preferred thickness of layer 12 is between about 700 to 3500 Angstroms. The buffer layer 14, on which the metal contact will be formed, is patterned from the second polysilicon layer 14, as shown in FIG. 4B and is also indicated in the elevational view of FIG. 3. The preferred thickness of the buffer layer 14 is between about 1500 to 3000 Angstroms. The second insulating layer 16, over the buffer layer 14 is also shown in FIG. 4B. The insulating layer 16 is usually a CVD silicon oxide and deposited by CVD, for example, by using reactant gas mixture containing silane ($SiH_4$) or TEOS and the preferred thickness of insulating layer 16 is between about 700 to 3000 Angstroms.

A third polysilicon layer is deposited and patterned to form the gate electrode of the TFT, but is not shown in the Figs because the layer is not directly used in making the metal contact. However, the third polysilicon layer is important for forming an $N^+$ dopant gate electrodes for the P-channel thin film transistor (TFT). A third insulating layer 18 is then deposited to form a relatively thin gate oxide on the TFT gate electrode. This gate oxide layer, however, extends over the buffer layer 14, and is shown in FIG. 4B. Typically the gate oxide 18 is formed by a high temperature (800° C.) low pressure chemical vapor deposition (LPCVD) using a gas mixture of dichlorosilane ($SiCl_2H_2$) and nitrous oxide ($N_2O$), and the preferred thickness of layer 18 is between about 50 to 500 Angstroms.

Now important to the invention, a first contact opening 3 is anisotropically and selectively plasma etched in the third and second insulating layer 18 and 16 to the $N^+$ polysilicon buffer layer 14. For example, the opening can be in a reactive ion etcher using a etch gas mixture containing carbon tetrafluoride ($CF_4$) and hydrogen ($H_2$). Alternatively, a trifluoromethane ($CHF_3$) gas can also be used. However, the etch stop is not critical to the invention, since the buffer layer 14 is relatively thick.

Still referring to FIG. 4B, a blanket thin fourth polysilicon layer 20 is deposited to form the channel layer for the thin film transistor (TFT). Typically, layer 20 is deposited at a low temperature to form a thin amorphous silicon layer, but for the purpose of this invention is simply referred to as a thin polysilicon layer. This thin polysilicon layer 20 also extends over the second insulating layer 16 and in the first contact opening 3, and makes contact to buffer layer 14 in the opening. The preferred thickness of layer 20 is between about 50 to 700 Angstroms and is usually lightly doped $N^-$ type (e.g. 1.0 E 16 to 1.0 E 18 atoms/$cm^3$) for the channel region over the TFT gate electrode regions (not shown in the Figs). The fourth polysilicon layer 20 is then doped selectively by forming a photoresist implant mask and ion implanting with a P type dopant, such as boron 11 ($B^{11}$) isotopes. The implant mask prevents implantation of $B^{11}$ in the channel regions of the TFT, but forms a $P^+$ electrically conductive layer 20 elsewhere on the substrate, and in particular over and in the first contact opening 3, as shown in FIG. 4B. Typically, the $P^+/N^+$ junction formed between layers 20 and 14 forms a poor (non-ohmic) electrical contact, as described and used in the prior art and shown in FIG. 2. As will become apparent soon, this invention eliminates the $P^+/N^+$ junction problem while reducing the metal contact area on the integrated circuit.

The fourth polysilicon layer 20 is patterned using conventional photolithographic techniques and plasma etching to define the channel width over the TFT gate electrode (not shown) and to form the TFT source/drain areas (also not shown) and to form the $P^+$ conducting stripe that connect the source of the TFT to the metal contact area over the first opening 3, as shown in FIG. 4B. The portion of layer 20 that connects to the TFT source is designated 20' on the left of the contact opening 3 to indicate the direction of the conducting stripe that connects to the source area of the TFT that is out of view in FIG. 4.

Figure 5:
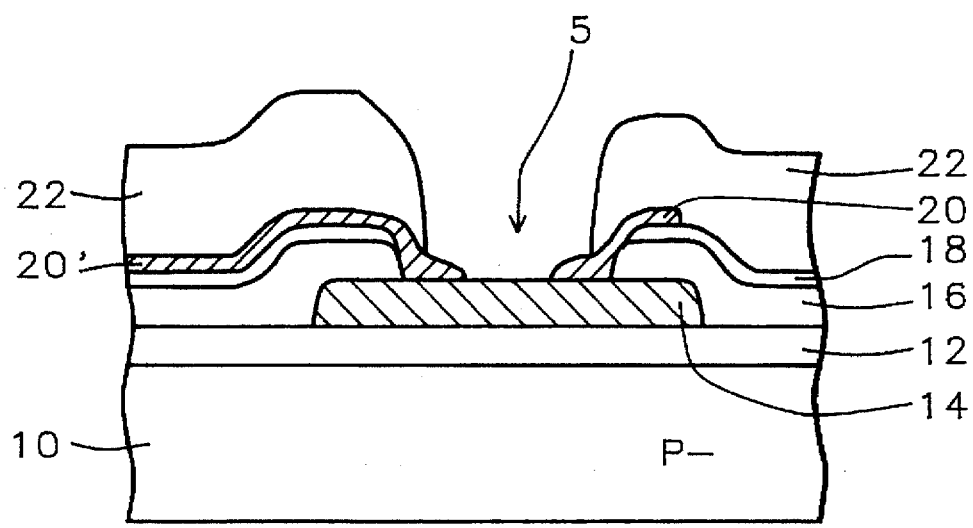

Referring next to FIG. 5, a fourth insulating layer 22 is deposited over the patterned fourth polysilicon layer and elsewhere on the substrate surface. The layer 22 is preferably composed of a borophoshosilicate glass (BPSG), and is deposited, for example, by chemical vapor deposition (CVD) using a reactant gas mixture, such as, silane ($SiH_4$) and oxygen ($O_2$) or silane nitrous oxide ($N_2O$) while adding dopant gases, such as phosphine ($PH_3$) and a diborane (6) ($B_2H_6$). The preferred thickness of layer 22 is between about 8000 to 13000 Angstroms. The BPSG has a low flow temperature and can be annealed to provide a leveling effect that forms a more planar surface of the insulating layer 22. This generally improve the photoresist image and provides a better process etch step that is now performed. However, this annealing step is not essential to the success of the invention.

Now an important feature of the invention is the formation of a second contact opening 5 in the BPSG layer that is aligned to and over the first contact opening 3, as shown in FIG. 5 and in the elevational view of FIG. 3. The second contact opening 5 is smaller in size (width) than the first contact opening 3 and is anisotropically etched to the surface of the of the buffer layer 14, as shown in FIG. 5. The etching is preferably done in a reactive ion etcher (RIE) or in a high plasma density etcher. The etch gas having a good etch selectivity of silicon oxide to silicon is preferred. For example, a gas mixture containing carbon tetrafluoride ($CF_4$) and hydrogen ($H_2$) or alternatively, a trifluoromethane ($CHF_3$) gas can also be used. However, the etch step is not very critical because of the buffer layer 14 which provides a barrier to over-etching into the first insulating layer 12. The remaining $P^+$ polysilicon layer 20 on the bottom surface of layer 14 or the exposed portions of polysilicon layer 20 on the sidewall of opening 5 can be easily contacted for making good electrical connections.

Referring now to FIG. 6, a first metal layer 30 is deposited on the fourth insulating layer 22 and in the contact opening 5, and thereby making electrical contact directly to the thin polysilicon layer 20. The first metal layer 30 is preferably aluminium (Al) metal or an aluminium copper alloy, and preferably the Al is deposited after first forming a penetration barrier layer on the surface in the contact opening 5. For example a refractory metal, such as tungsten (W), titanium (Ti), can be used. Alternatively, a tungsten plug can be formed in the opening 5 to serve as a contact and a barrier layer. For example, the tungsten can be deposited by chemical vapor deposition using a reactant gas mixture containing tungsten hexafluoride ($WF_6$). The tungsten is then etched back to the surface of insulating layer 22 to form W plugs. An aluminium layer can then be deposited and patterned by conventional means to form the interconnecting first level of wiring. The aluminium can be deposited by any one of several means, such as by sputtering deposition or physical vapor evaporation.

Figure 11:
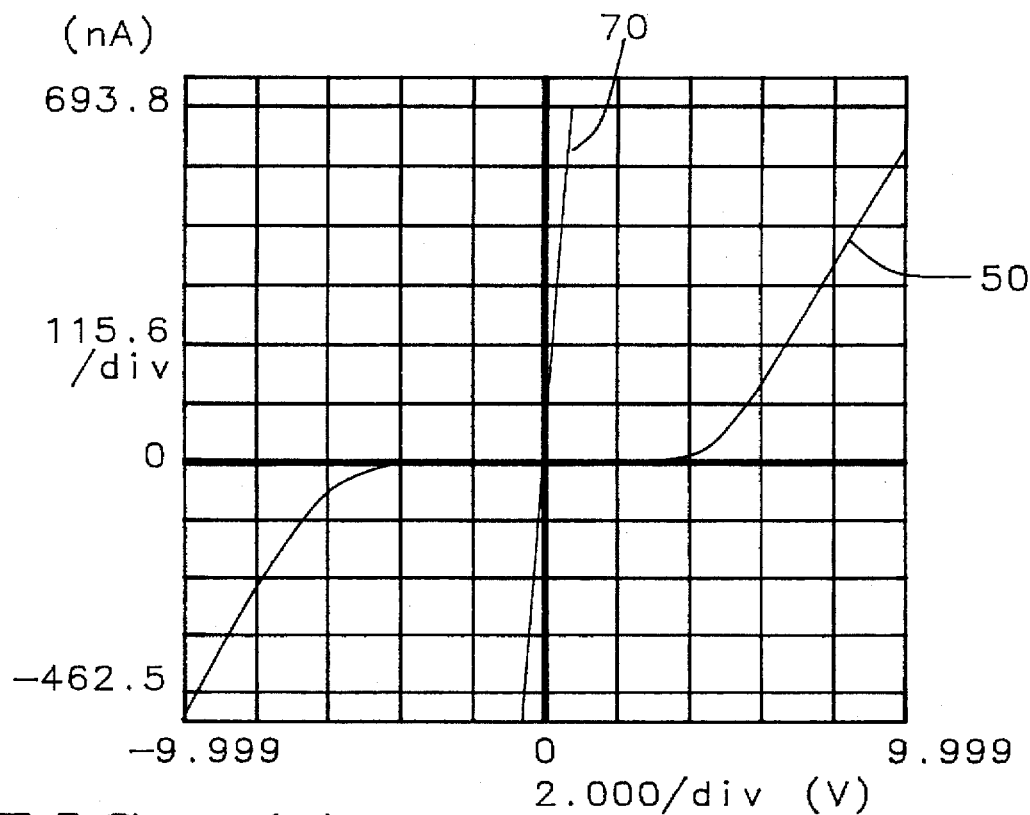
FIG. 11 shows a graph for the current-voltage (I/V) trace for a test structure of the prior art metal contact showing the $P^+/N^+$ diode characteristics.
Figure 12:
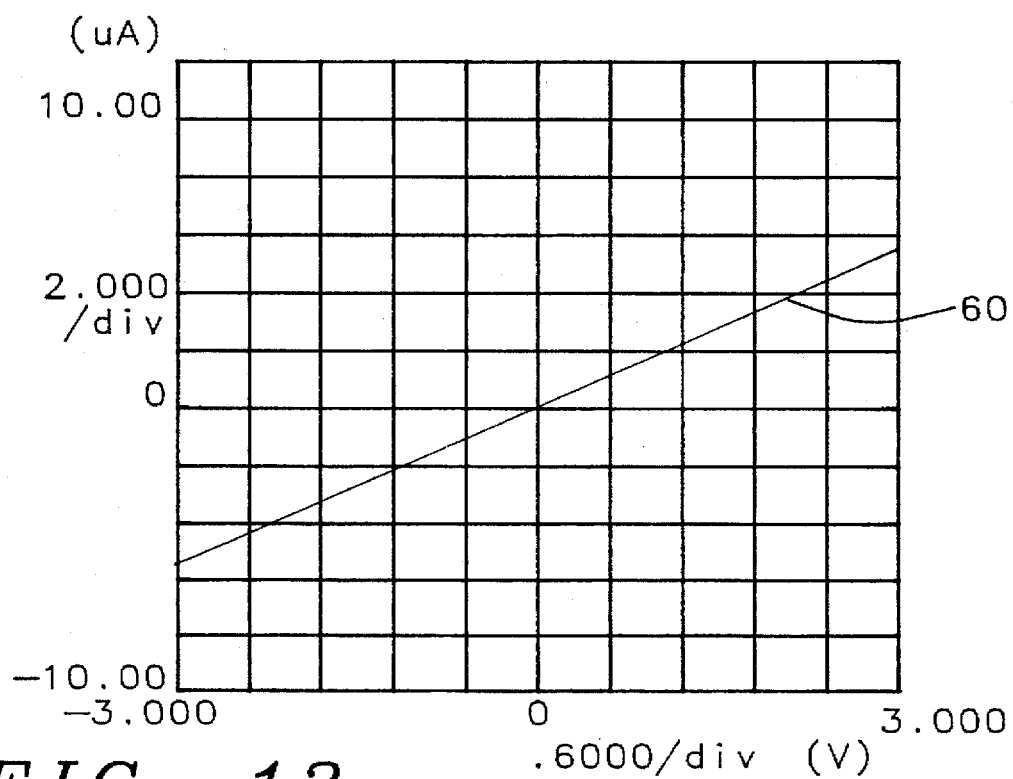
FIG. 12 shows a graph for the current-voltage (I/V) trace for a test structure of the metal contact of this invention having very good low resistance ohmic characteristics.

As mentioned earlier, the first metal layer 30 contacts directly the thin $P^+$ fourth polysilicon layer 20 in the contact opening 5 (FIG. 5). This result in a very low ohmic contact resistance compared to the method of the prior art. By way of example, a current/voltage (I–V) trace is shown in FIG. 11 between two contacts built by the prior art. As clearly seen in FIG. 11 the I–V trace 50 is very non ohmic and shows the P⁺/N⁺ diode characteristics of the back to back diodes formed from the two contacts. The break down voltage being about 3.0 to 4.0 volts. On the other hand, a current-voltage trace between two contacts built by the method of this invention is shown in FIG. 12. As is clearly seen in FIG. 12 the I–V trace 60 has ohmic characteristics. Also the current scale on the vertical axis in FIG. 11, for the prior art, is in nanoamperes ($1\times10^{-9}$ Amps.), while the current scale in FIG. 12 for the current invention is in micoamperes ($1\times10^{-6}$ Amps.). The dramatic improvement in current characteristics is best illustrated by plotting the I–V trace of FIG. 12 on the plot in FIG. 11, as shown labeled 70 in FIG. 11. The trace 70 for the present invention is essentially vertical in FIG. 11 showing the much lower contact resistance for similar sheet resistance P⁺ films. The measurements were made between two contacts similar to the contacts shown in FIGS. 1 and 7 for the conventional and contact of this invention, respectively. The patterned polysilicon layer between contacts was about 1.0 micrometer in width and about 100 micrometers in length. The polysilicon layer was about 300 Angstroms thick and was implanted with $BF_2$ ions at a dose of 1.0 E 15/cm² and an implant energy of about 25.0 KeV. The resultant sheet resistance ($R_s$) was 3500 to 5000 ohms/square.

A second important contribution of the invention is the area reduction of the metal contact which substantially increases the packing density of devices on the integrated circuit. Given the same design ground rules for the prior art contact structure, shown in FIG. 1 and the metal contact structure of the present invention, shown in FIG. 3, the invention result in about a 28 percent reduction in area.

Referring now more specifically to FIGS. 7 through 10, a second embodiment is shown for forming a self-aligning contact that further reduces the area of the metal contact. Many of the process steps in the second embodiment are the same as the process in the first embodiment, and their discussion are not repeated in the same detail. Similar structures and layer in both embodiments are also consistently labeled the same.

Figure 7:
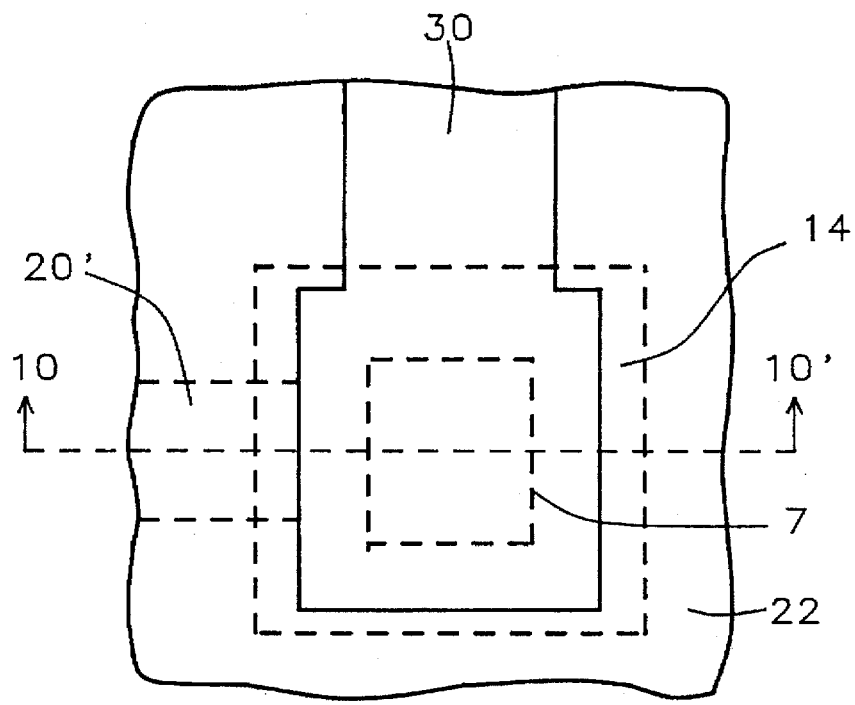
FIG. 7 shows a schematic elevational view for the contact structure for the second embodiment of the invention.
Figure 8:
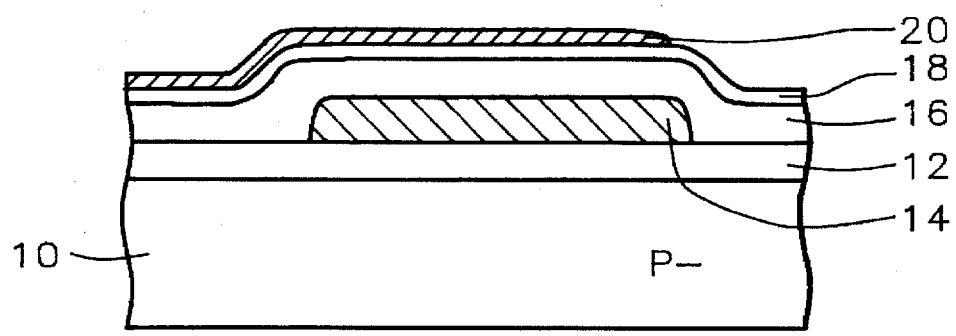
FIGS. 8 through 10 show the schematic cross sectional view of the metal contact structure for the second embodiment.
Figure 9:
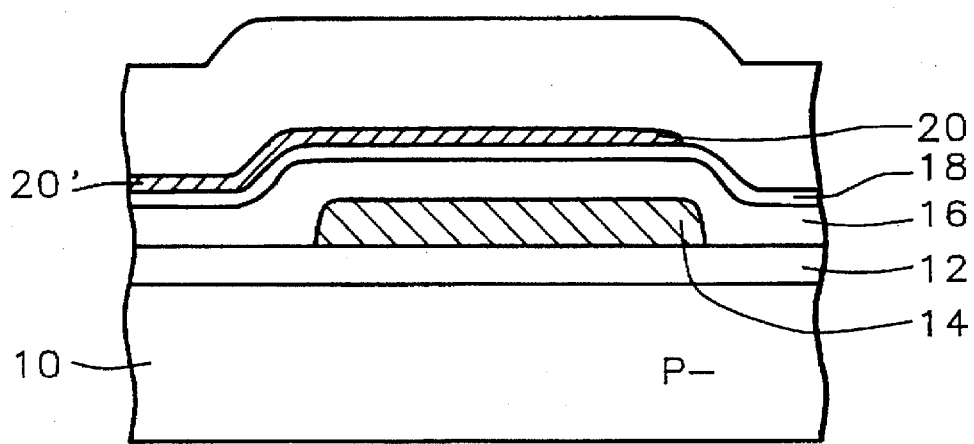
Figure 10:
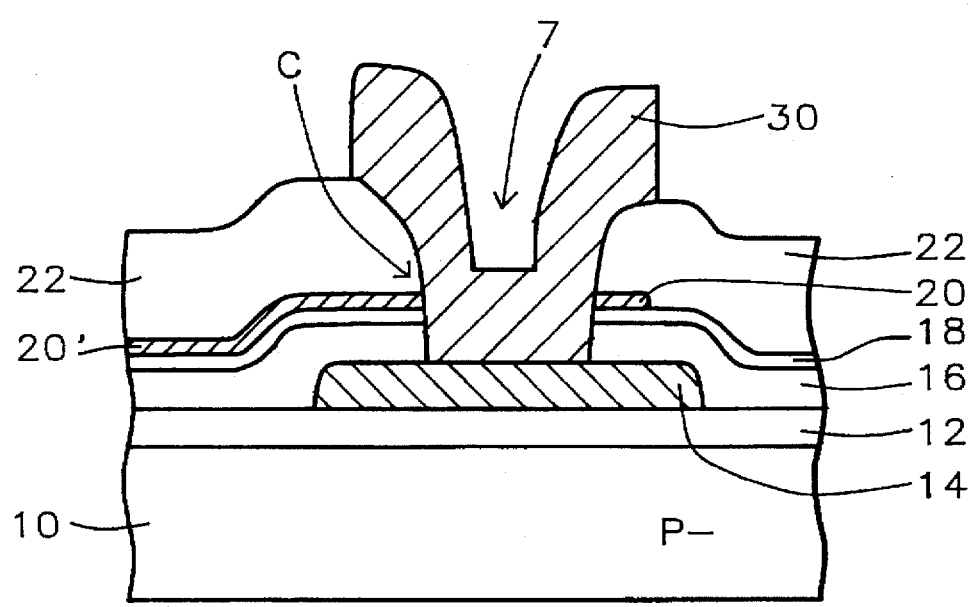

Referring now to FIG. 7, an elevational view is shown of the self-aligned metal contact for the completed structure shown in FIG. 10. The series of partially completed structures shown in FIGS. 8 through 10 are for cross sectional view through the region 10—10' as depicted in FIG. 7.

The method for making the self-aligned reduced area metal contact of this second embodiment is the same as the first embodiment up to but not including the step for forming the first contact opening 5 in FIG. 4. Briefly, the process up to the first contact opening consist of forming a first insulating layer 12 on a P⁻ silicon substrate 10. A buffer layer 14 is then formed from an N⁺ doped second polysilicon layer 14, as shown in FIG. 8. The buffer layer 14 is then insulated by a second insulating layer 16 and an N⁺ doped third polysilicon (not shown) is patterned to form a gate electrode for the thin film transistor, which is also not shown in the Fig. A thin gate oxide is formed on the TFT gate electrode by depositing a third insulating layer 18, which is also formed over the second insulating layer 16 and over the buffer layer 14, as shown in FIG. 8. Now as shown in FIG. 8, the first contact opening 5 in FIG. 4B of the first embodiment is omitted in the insulating layers 18 and 16 of the second embodiment. Instead the channel layer is formed by the method of the first embodiment by depositing a fourth polysilicon layer 20, and similar to the first embodiment, the layer is selectively ion implanted with P⁺ dopant ($B^{11}$) to from the P+ source/drain areas of the P-channel TFT, and the P+ doped regions over the buffer layer 14. The fourth polysilicon layer is then patterned to define the channel layer over the TFT, the source/drain areas and the connecting P⁺ stripe 20' from the TFT source (not shown) to the buffer layer 14. A fourth insulating layer 22 composed of BPSG is deposited next, as shown in FIG. 9. The layer thickness and deposition methods are the same as in the first embodiment.

Now as shown in FIG. 10, a single contact opening 7 is formed in layer 22 by conventional photoresist masking and anisotropic etching. The opening 7 is aligned over the buffer layer 14, and is etched through layers 22, 20, 18 and 16 to the surface of the buffer layer 14. The etch stop is not critical because of the relatively thick buffer layer.

A metal layer 30 is deposited over the insulating layer 22 and in the contact opening 7 and then patterned by conventional means to form the first metal wiring level and complete the self-aligned metal contact having reduce area. The preferred metal is an aluminium or aluminium copper alloy with a barrier layer such a tungsten or a tungsten plug process, as in the first embodiment. Also, the metal layer 30 can be composed of titanium and titanium nitride (Ti and TiN) or aluminum-silicon-copper (AlSiCu) alloy and TiN, and is deposited to a thickness of between about 4000 and 6000 Angstroms.

Several important features relating to the second embodiment are discussed. The P⁺ connecting stripe 20' is self-aligned to the metal in the opening 7 at the sidewall region location labeled C in FIG. 10. This contact has a low ohmic resistance, comparable in value to the metal contact of the first embodiment. Because a single contact is used the layout design ground rules can be even tighter than in the first embodiment, thereby reducing further the area required for making the contact. For example, the reduction in area of the buffer layer 14 of FIG. 10 is further reduced over the prior art design layout of FIG. 1 by about 43 percent. Still another important feature is the elevation of the P+ connect layer 20' above the surface of the buffer layer 14 by at least the thickness of layer 16 and 18. This provides considerable latitude in over or under etching the contact opening 7 and still provide good contacts, and thereby makes the process very manufacturable.

While the invention has been particularly shown and described with reference to the preferred embodiments thereof, it will be understood by those skilled in the art that various changes in form and details may be made without departing from the spirit and scope of the invention. For example, while the invention was direct at making good low resistance ohmic contacts for P-channel thin film transistor commonly used on SRAM cells, the process is equally applicable to other thin film structure where a good contact between P+ and N+ polysilicon layers are required.

What is claimed is:

1. A reduced area self-aligned metal contact to a thin polysilicon layer contiguous with and forming a portion of a thin film transistor on a semiconductor substrate, comprising the steps of:

a semiconductor substrate having semiconductor devices formed from patterned first and second polysilicon layers and having a first insulating layer there between, and a separate portion of said second polysilicon layer forming also a buffer layer;

a second insulating layer on said buffer layer and on said substrate;

a patterned third polysilicon layer forming a gate electrode for said thin film transistor;

a third insulating layer on said patterned third polysilicon layer and forming a gate oxide on said gate electrode and said gate oxide extending over said buffer layer;

a patterned thin fourth polysilicon layer over said third insulating layer doped selectively to form source and drain area for said thin film transistor, and said patterned thin fourth polysilicon layer formed to provide doped electrically conducting stripe contiguous with one of said source and drain areas and extending over said buffer layer;

a fourth insulating layer over said patterned fourth polysilicon layer;

said fourth insulating layer having a contact opening to said buffer layer with portions of sidewall formed from said thin fourth polysilicon layer;

a patterned first metal layer over said fourth insulating layer and in said contact opening, and making low resistance ohmic contact to said fourth polysilicon layer, and thereby having a reduced area self-aligned metal contact to said thin fourth polysilicon layer contiguous with said one of said source and drain areas of said thin film transistor, said first metal layer connects to a power supply.

2. The metal contact of claim 1, wherein said metal layer is composed of Ti and TiN or AlSiCu alloy and TiN having a thickness of between about 4000 to 6000 Angstroms.

3. The metal contact of claim 1, wherein said metal layer in said contact opening contacts said fourth polysilicon layer, and thereby forms a low resistance ohmic contact to said one of said source and drain areas of said thin film transistor.

* * * * *